United States Patent
Tawa

(10) Patent No.: US 10,952,350 B2
(45) Date of Patent: Mar. 16, 2021

(54) COOLING DEVICE AND ELECTRONIC APPARATUS

(71) Applicant: FUJITSU LIMITED, Kawasaki (JP)

(72) Inventor: Fumihiro Tawa, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/742,966

(22) Filed: Jan. 15, 2020

(65) Prior Publication Data
US 2020/0236809 A1    Jul. 23, 2020

(30) Foreign Application Priority Data

Jan. 23, 2019  (JP) .............................. JP2019-009287

(51) Int. Cl.
*H05K 7/20*    (2006.01)

(52) U.S. Cl.
CPC ..... *H05K 7/20327* (2013.01); *H05K 7/20445* (2013.01)

(58) Field of Classification Search
None
See application file for complete search history.

(56) References Cited

U.S. PATENT DOCUMENTS

| | | | | |
|---|---|---|---|---|
| 4,619,316 A | * | 10/1986 | Nakayama ............ | F28F 13/187 165/104.33 |
| 8,432,695 B2 | * | 4/2013 | Yoshikawa ........... | H01L 23/473 361/709 |
| 10,020,242 B2 | * | 7/2018 | Katsumata ......... | H05K 7/20936 |
| 2004/0104022 A1 | * | 6/2004 | Kenny ................ | F28D 15/0266 165/299 |
| 2007/0053152 A1 | * | 3/2007 | Ouyang ................... | G06F 1/20 361/679.47 |
| 2007/0089859 A1 | * | 4/2007 | Wei ...................... | H01L 23/467 165/80.4 |
| 2009/0266515 A1 | * | 10/2009 | Oikawa .............. | H05K 7/20272 165/80.4 |
| 2018/0279507 A1 | * | 9/2018 | Midgley ............ | H05K 7/20772 |

FOREIGN PATENT DOCUMENTS

| | | |
|---|---|---|
| JP | 2013-197519 | 9/2013 |
| WO | 2018/037540 A1 | 3/2018 |

* cited by examiner

*Primary Examiner* — Courtney L Smith
(74) *Attorney, Agent, or Firm* — Fujitsu Patent Center

(57) ABSTRACT

A cooling device includes a circulation channel through which a refrigerant is circulated, a heat receiving part which is disposed in the circulation channel and in which the refrigerant receives heat generated by a heat generating component, a heat dissipating part which is disposed in the circulation channel and in which the refrigerant dissipates the heat received in the heat receiving part, a pump which is disposed in the circulation channel and which sends the refrigerant to the heat receiving part, and a tank which is coupled to the circulation channel and which has a space therein, wherein the tank is disposed at a higher position in a vertical direction than the pump in a state where the pump is located on an upper side in the vertical direction with respect to the heat receiving part and the heat dissipating part.

16 Claims, 10 Drawing Sheets

COOLING DEVICE AND ELECTRONIC APPARATUS

CROSS-REFERENCE TO RELATED APPLICATION

This application is based upon and claims the benefit of priority of the prior Japanese Patent Application No. 2019-9287, filed on Jan. 23, 2019, the entire contents of which are incorporated herein by reference.

FIELD

The embodiments discussed herein are related to a cooling device and an electronic apparatus.

BACKGROUND

Since an electronic apparatus generates heat due to its use, there is a case where a cooling device for circulating a refrigerant by a pump is incorporated into the electronic apparatus. Usually, the pump is preferably operated in a state where the pump is filled with a refrigerant. For this reason, to inhibit air from being sent into the pump as much as possible, there is known a configuration in which a guide pipe is provided in a storage tank of the refrigerant so as to be rotatable via a coupling part so that an intake port thereof is not exposed from the refrigerant stored in the storage tank. There a suggestion in which an outflow port of a cooling liquid to be supplied to a pump is provided substantially at the center of a tank, a partition plate is provided between a communication port for allowing the cooling liquid to flow into the tank and the outflow port of the cooling liquid, and air bubbles are inhibited from moving to the outflow port.

As examples of related art, Japanese Laid-open Patent Publication No. 2013-197519, International Publication Pamphlet No. WO 2018/037540, and the like, have been disclosed.

SUMMARY

According to an aspect of the embodiments, a cooling device includes a circulation channel through which a refrigerant is circulated, a heat receiving part which is disposed in the circulation channel and in which the refrigerant receives heat generated by a heat generating component, a heat dissipating part which is disposed in the circulation channel and in which the refrigerant dissipates the heat received in the heat receiving part, a pump which is disposed in the circulation channel and which sends the refrigerant to the heat receiving part, and a tank which is coupled to the circulation channel and which has a space therein, wherein the tank is disposed at a higher position in a vertical direction than the pump in a state where the pump is located on an upper side in the vertical direction with respect to the heat receiving part and the heat dissipating part.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
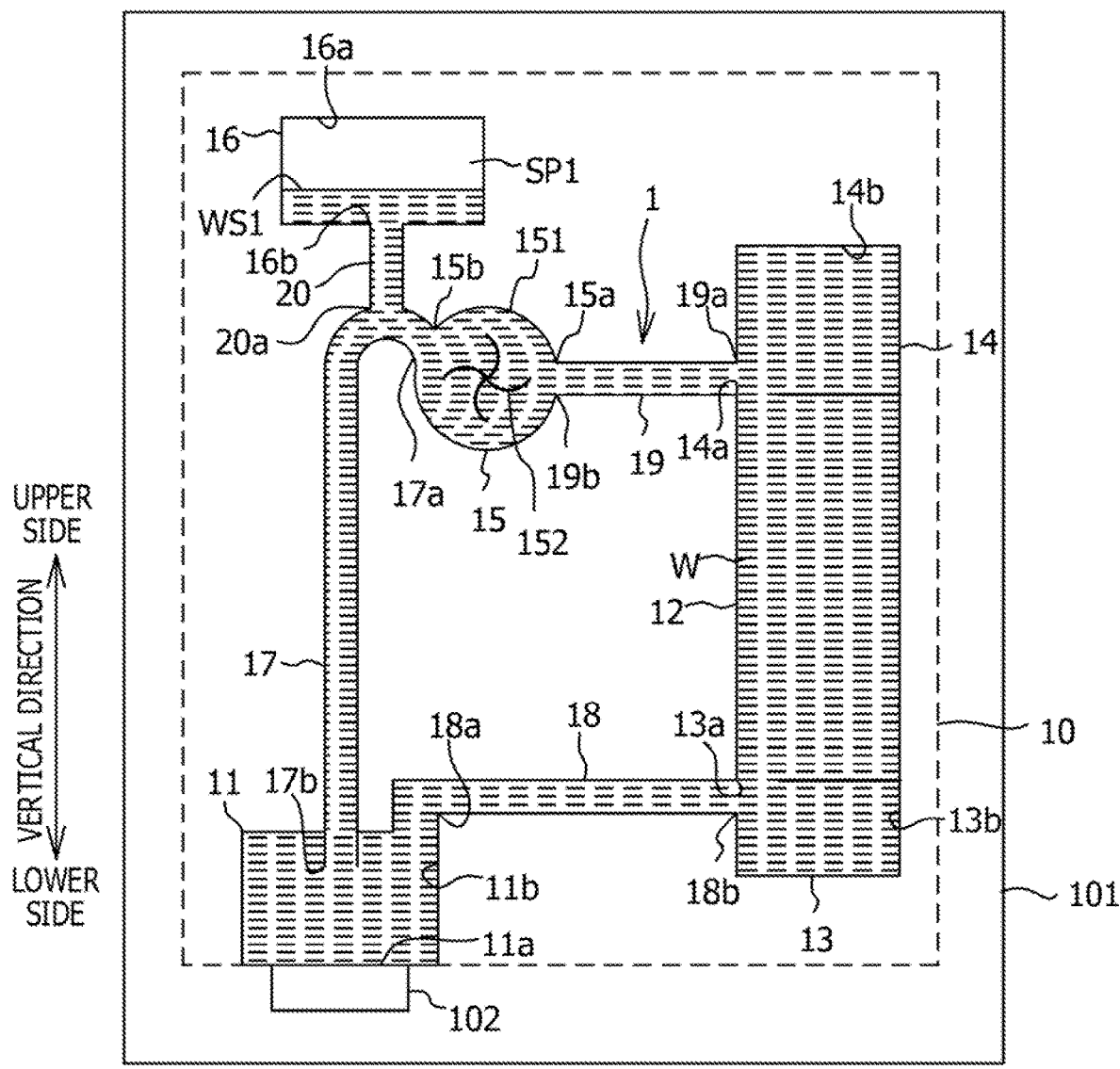
FIG. 1 is an explanatory diagram schematically illustrating an electronic apparatus provided with a cooling device according to a first embodiment, and illustrating a situation when a pump is stopped in a state where a tank provided in the cooling device is located on the upper side in the vertical direction.

There is known a boiling-type cooling device in which a space is provided in a region where a refrigerant is circulated so that the refrigerant is allowed to boil, and that utilizes latent heat accompanying a phase change when the refrigerant boils. As an example of such a boiling-type cooling device, there is a decompression-boiling-type cooling device in which a space provided in a region where a refrigerant is circulated is decompressed by vacuuming to adjust the boiling temperature of the refrigerant. In a state where no refrigerant is present in the pump, the refrigerant is not able to be compressed and sent in the decompression-boiling-type cooling device. In a case of a cooling device in which a space provided in a region where a refrigerant is circulated is not decompressed and air is present, the refrigerant may be compressed and sent due to a pump discharging air, even if some air is suctioned into the pump. However, in a state where the refrigerant is not present in the pump in the decompression-boiling-type cooling device, since no air is present in the pump, the refrigerant is not able to be compressed and sent. Therefore, in the case of the decompression-boiling-type cooling device, keeping the state of the inside of the pump to be filled with a refrigerant is important more than in the case of a cooling device in which decompression is not performed. In this respect, in the case of Japanese Laid-open Patent Publication No. 2013-197519, since the guide pipe is rotated by the coupling part, it is assumed that the intake port of the guide pipe is exposed from the refrigerant when the coupling part is defective and that the refrigerant in the pump becomes a state discharged depending on the posture of the electronic apparatus. In the case of International Publication Pamphlet No. WO 2018/037540, it is assumed that the refrigerant in the pump becomes a discharged state depending on the posture of the electronic apparatus.

In one aspect, an object of the disclosure in this specification is to keep a state where the inside of a pump provided in a cooling device is filled with a refrigerant, regardless of the posture of an electronic apparatus.

Hereinafter, embodiments of the present disclosure will be described with reference to the drawings. However, in the drawings, the dimensions, ratios, and the like, of respective parts may not be illustrated to be in absolute agreement with those of actual parts. In some drawings, for the convenience of description, the constituents actually present may be omitted or the dimensions may be illustrated in an exaggerated manner more than actual dimensions.

First Embodiment

First, a cooling device 10 according to a first embodiment will be described with reference to FIGS. 1 to 6. The cooling device 10 is incorporated in an electronic apparatus 100. The electronic apparatus 100 includes a heat generating component 102 in a housing 101. The cooling device 10 cools the heat generating component 102. Although the heat generating component 102 according to the present embodiment is a central processing unit (CPU), components which generate heat when the electronic apparatus 100 is used may be cooling targets of the cooling device 10. For example, in a case where the electronic apparatus 100 is a projector having a light source or the like, when these components generate heat, the cooling device 10 is able to cool these components as the heat generating components 102. The cooling device 10 may be preferably used for the electronic apparatus 100 under the assumption that the electronic apparatus 100 is in various installation postures when used. The housing 101 is illustrated only in FIG. 1 and the illustration of the housing 101 is omitted in the other drawings. In the drawings, a pipe for decompression which is performed at the time of manufacturing is omitted.

The cooling device 10 includes a circulation channel 1 in which a refrigerant W is circulated. The circulation channel 1 includes a heat receiving part 11 in which the refrigerant W receives the heat generated by the heat generating component 102, a heat dissipating part 12 in which the refrigerant W dissipates the heat received in the heat receiving part 11, and a first pump 15 that sends the refrigerant W to the heat receiving part 11.

Although the refrigerant W according to the present embodiment is pure water, other refrigerant may be also used. The cooling device 10 according to the present embodiment is of a boiling-type, and, to allow the refrigerant W to boil, a region where the liquid-phase refrigerant W is not present is formed in part of the internal space of the cooling device 10. It is preferable that a gas different from the gas of the refrigerant W be excluded from the region so as not to inhibit the efficient boiling of the refrigerant W.

When pure water is used as the refrigerant W, the boiling temperature of the refrigerant W at 1 atmospheric pressure (atm) is 100° C. However, it is preferable that the elements of the electronic apparatus 100 be cooled to about 50° C. by the cooling device 10 in consideration of the heat-transfer coefficient. Therefore, in the case of the cooling device 10 according to the present embodiment, the boiling point is lowered by adjusting the internal pressure to 0.1 atm. The refrigerant W which has been deaerated is injected into the cooling device 10 so that, for example, a gas, such as nitrogen or oxygen, which is different from the gas of the refrigerant W, is not generated when the enclosed refrigerant W is in a liquid state or boiling. By deaerating the refrigerant W, dissolution of other kinds of gases into the refrigerant W is excluded.

The circulation channel 1 includes a first pipe 17, a second pipe 18, and a third pipe 19. A first end portion 17a of the first pipe 17 is coupled to a discharge port 15b of the pump 15. A second end portion 17b of the first pipe 17 is disposed so as to be opened in the heat receiving part 11. For example, the first pipe 17 allows the refrigerant W to flow from the pump 15 toward the heat receiving part 11. A first end portion 18a of the second pipe 18 is coupled to the heat receiving part 11. A second end portion 18b of the second pipe 18 is coupled to the heat dissipating part 12. For example, the second pipe 18 allows the refrigerant W toward flow from the heat receiving part 11 to the heat dissipating part 12. However, in the present embodiment, since an upstream tank 13 is provided on the upstream side of the heat dissipating part 12 as described below, the second end portion 18b of the second pipe 18 is coupled to an inlet port 13a of the upstream tank 13, and the second pipe 18 is coupled to the heat dissipating part 12 via the upstream tank 13. A first end portion 19a of the third pipe 19 is coupled to the heat dissipating part 12. A second end portion 19b of the third pipe 19 is coupled to a suction port 15a of the pump 15. For example, the third pipe 19 allows the refrigerant W to flow from the heat dissipating part 12 toward the pump 15. However, in the present embodiment, since a downstream tank 14 is provided on the downstream side of the heat dissipating part 12 as described below, the first end portion 19a of the third pipe 19 is coupled to a discharge port 14a of the downstream tank 14, and the third pipe 19 is coupled to the heat dissipating part 12 via the downstream tank 14.

The heat receiving part 11 includes a heat generating component installation portion 11a for bringing the heat generating component 102 into contact with the heat generating component. The heat receiving part 11 also has a space for storing a refrigerant therein, for example, a heat-receiving-part storage portion 11b. The first pipe 17 extends into the heat-receiving-part storage portion 11b, and a second end portion 17b thereof reaches the inside of the heat-receiving-part storage portion 11b and opens. The second end portion 17b is in a state to face the heat generating component installation portion 11a.

Figure 2:
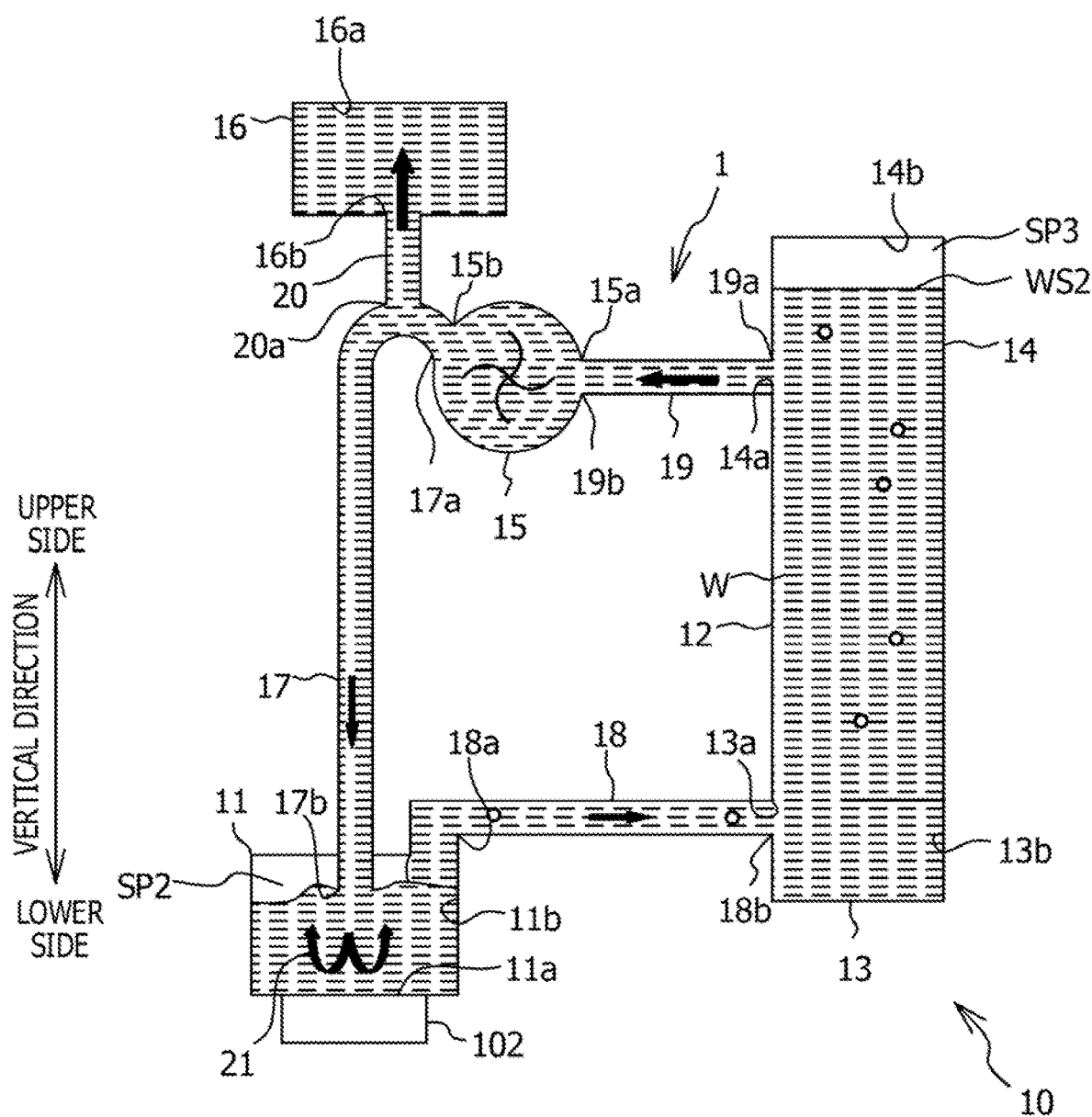
FIG. 2 is an explanatory diagram schematically illustrating the cooling device according to the first embodiment, and illustrating a situation when the pump is operated in the state where the tank provided in the cooling device is located on the upper side in the vertical direction.

The heat dissipating part 12 is a so-called radiator. The upstream tank 13 is provided on the upstream side of the heat dissipating part 12, and an upstream storage portion 13b for the refrigerant W is formed. The downstream tank 14 is provided on the downstream side of the heat dissipating part 12, and a downstream storage portion 14b for the refrigerant W is formed. As illustrated in FIGS. 1 and 2, the downstream tank 14 is disposed at a higher position in the vertical direction than the pump 15 in a state where the pump 15 is located on the upper side in the vertical direction with respect to the heat receiving part 11 and the heat dissipating part 12.

The pump 15 includes a blade-shaped rotor 152 in a case 151. A gap is provided between the case 151 and the rotor 152. This is because, in a state where the rotor 152 is stopped, the gap allows the refrigerant W to move so that a region where the refrigerant W is not present is not formed in the pump 15, which results in the inside of the pump 15 being able to be filled with the refrigerant W. To move the refrigerant W in such a manner, a centrifugal pump is employed in the present embodiment.

The circulation channel 1 in which the heat receiving part 11, the heat dissipating part 12, and the first pump 15 are disposed has a sealed structure in which airtightness which is not affected by external pressure is ensured to control internal pressure. In the present embodiment, to control the pressure to be 0.1 atm inside the circulation channel 1, in which the heat receiving part 11, the heat dissipating part 12, and the first pump 15 are disposed, the parts inside the circulation channel 1 which come into contact with the refrigerant W are made of metal, and the parts are joined with each other by brazing to form the sealed structure.

The electronic apparatus 100 according to the present embodiment may be in various installation postures, and, for example, as illustrated in FIGS. 1 and 2, the electric apparatus 100 may be in such a posture that the pump 15 is located on the upper side in the vertical direction with respect to the heat receiving part 11 and the heat dissipating part 12. For example, the electronic apparatus 100 may be in a posture in which both of the suction port 15a and the discharge port 15b of the pump 15 are located above the heat receiving part 11 and the heat dissipating part 12. The cooling device 10 according to the present embodiment includes a tank 16 so that the inside of the pump 15 is filled with the refrigerant W, even when the electronic apparatus is in such a posture.

As illustrated in FIGS. 1 and 2, the tank 16 is disposed at a higher position in the vertical direction than the pump 15 in the state where the pump 15 is located on the upper side in the vertical direction with respect to the heat receiving part 11 and the heat dissipating part 12. This is for taking measures to inhibit a region where the liquid-phase refrigerant W is not present, the region which is formed in part of the internal space of the cooling device 10, from moving into the pump 15. FIG. 1 illustrates a situation when the pump is stopped, and FIG. 2 illustrates a situation when the pump is operated.

The tank 16 is coupled to the circulation channel 1, for example, the tank 16 is coupled to the circulation channel 1 via a branch pipe 20 branched from the first pipe 17. The branch pipe 20 is branched from a branch point 20a provided in the first pipe 17. As illustrated in FIG. 1, the branch pipe 20 extends upward in the state where the pump 15 is located on the upper side in the vertical direction with respect to the heat receiving part 11 and the heat dissipating part 12. A communication port 16b is provided at the bottom of the tank 16, and the branch pipe 20 is coupled to the communication port 16b. By providing the tank 16 with the branch pipe 20 being interposed as described above, the tank 16 is disposed at a higher position in the vertical direction than the pump 15. By using the branch pipe 20, when the cooling device 10 is in the posture illustrated in FIG. 1, the tank 16 is easily located at a position higher than the pump 15. In the present embodiment, the tank 16 is coupled to the first pipe 17 to facilitate attaining the positional relationship with the pump 15. Alternatively, the tank 16 may be coupled to the third pipe 19 for a reason similar to the above.

The tank 16 has a space 16a therein, and, when the cooling device 10 is in the posture illustrated in FIG. 1 in a state where the pump 15 is stopped, a liquid surface WS1 of the refrigerant W is located within the tank 16. For example, a region where the liquid-phase refrigerant W is not present, the region which is formed in part of the internal space of the cooling device 10 as a result of the refrigerant W moving downward due to gravity thereof, is formed in the space 16a as a space SP1. As described above, when the cooling device 10 is in the posture illustrated in FIG. 1, since the pump 15 is located below the liquid surface WS1, the inside of the pump 15 becomes a state filled with the refrigerant W.

Such a tank 16 is a tank for temporarily accommodating a region where the liquid-phase refrigerant W is not present, the region which is formed in the circulation channel 1, and the heat receiving part 11, the heat dissipating part 12, and the pump 15, which are disposed in the circulation channel 1, for example, the region which is formed in part of the internal space of the cooling device 10. Therefore, the tank 16 may be disposed at a position deviated from the first pipe 17, the second pipe 18, and the third pipe 19. For example, the tank 16 may be disposed at a position deviated from a path through which the refrigerant passes when the cooling device 10 is operated.

As described above, the tank 16 temporarily accommodates a region where the liquid-phase refrigerant W is not present, the region which is formed in part of the internal space of the cooling device 10. Therefore, it is preferable that, in a state where the refrigerant W is boiling, the capacity of the space 16a in the tank 16 be larger than the capacity occupied by the gas-phase refrigerant W in a region where the circulation channel 1, the heat receiving part 11, the heat dissipating part 12, and the pump 15 are combined. In the present embodiment, it is preferable that the capacity of the space 16a be larger than the capacity occupied by the gas-phase refrigerant W in part of the cooling device 10 excluding the internal capacities of the tank 16 and the branch pipe 20.

When the refrigerant W is boiling, liquid-phase part is decreased and gas-phase part is increased. For example, the amount of gas-phase refrigerant W is increased. As described above, even in a state where the amount of gas-phase refrigerant W is increased, if the capacity of the space 16a is larger than the capacity occupied by the gas-phase refrigerant W, a region where the liquid-phase refrigerant W is not present is able to be accommodated in the space 16a. If a region where the liquid-phase refrigerant W is not present is able to be accommodated in the space 16a, the inside of the pump 15 is able to be filled with the liquid-phase refrigerant W.

As described above, by using the cooling device 10 according to the present embodiment, since, as illustrated in FIG. 1, the pump 15 becomes the posture in which the pump 15 is located on the upper side in the vertical direction with respect to the heat receiving part 11 and the heat dissipating part 12, the inside of the pump 15 is able to be filled with the liquid-phase refrigerant W, even when the pump 15 is stopped.

As illustrated in FIG. 2, even when the pump 15 is operated, the inside of the pump 15 is filled with the liquid-phase refrigerant W, and the cooling device 10 is able to be operated continuously. The state of the refrigerant W when the cooling device 10 is operated will be described with reference to FIG. 2. The cooling device 10 starts being operated when the electronic apparatus 100 is powered on. The pump 15 starts being operated at the start of the operation of the cooling device 10.

When the pump 15 is operated, the refrigerant W is discharged from the discharge port 15b of the pump 15 to the first pipe 17. The discharged refrigerant W is supplied to the heat receiving part 11 through the first pipe 17. The refrigerant W supplied to the heat receiving part 11 is blown to the heat generating component installation portion 11a as indicated by arrow 21, and boils as a result of receiving the heat of the heat generating component 102. Therefore, a space SP2 is formed in the heat receiving part 11 by the gas-phase refrigerant W. The refrigerant W in a state of a gas-liquid mixed phase is sent to the heat dissipating part 12 through the upstream tank 13. In the heat dissipating part 12, the refrigerant W is cooled. Therefore, part of the gas-phase refrigerant W returns to a liquid phase. Part of the gas-phase refrigerant W which has not returned to a liquid phase and a region where the liquid-phase refrigerant W is not present, the region which is formed originally in part of the internal space of the cooling device 10, are collected in the downstream storage portion 14b in the downstream tank 14. As a result, a liquid surface WS2 appears in the downstream tank 14, and a space SP3 is formed. This is because the downstream tank 14, like the tank 16, is disposed at a higher position in the vertical direction than the pump 15 in the state where the pump 15 is located on the upper side in the vertical direction with respect to the heat receiving part 11 and the heat dissipating part 12.

The liquid-phase refrigerant W which has passed through the heat dissipating part 12 is suctioned into the suction port 15a of the pump 15 again, and is discharged by the pump 15.

When the pump 15 is operated, the inside of the tank 16 is in a state filled with the refrigerant W due to the discharge pressure of the pump 15.

Figure 3:
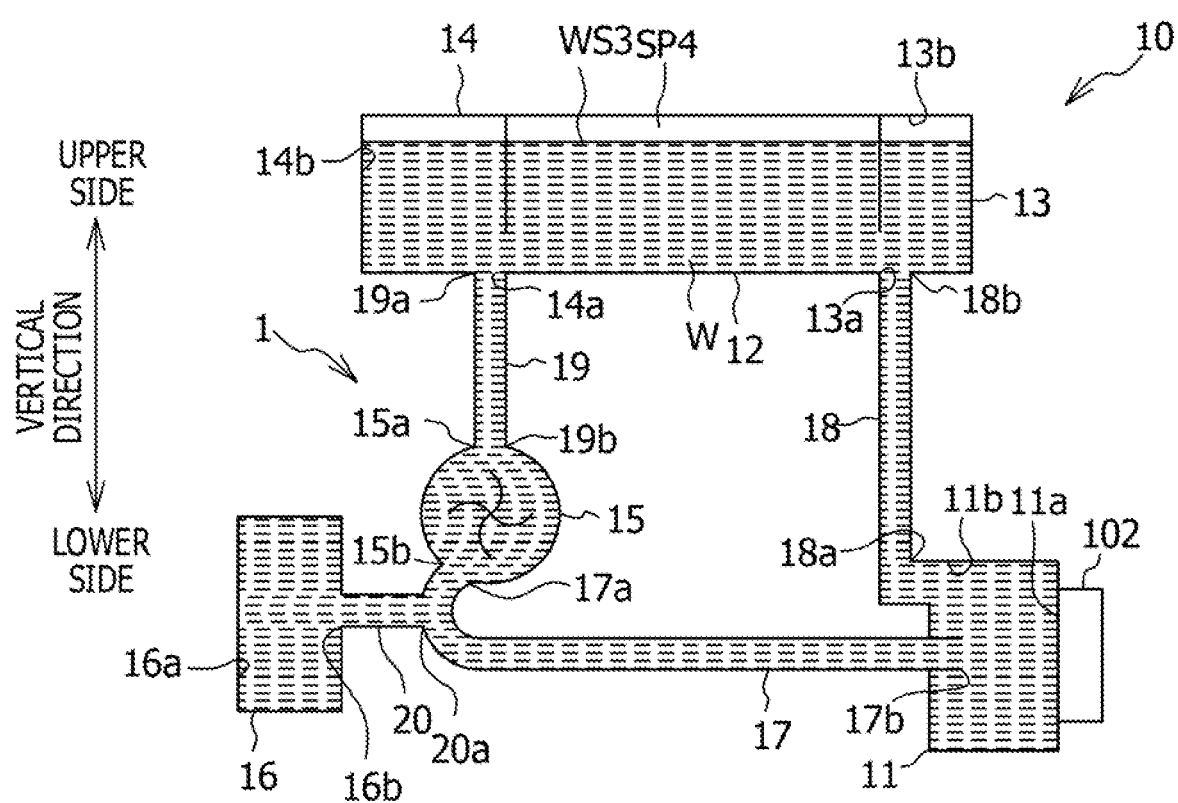
FIG. 3 is an explanatory diagram schematically illustrating the cooling device according to the first embodiment, and illustrating a situation when the pump is stopped in a state where a heat dissipating part provided in the cooling device is located on the upper side in the vertical direction.
Figure 4:
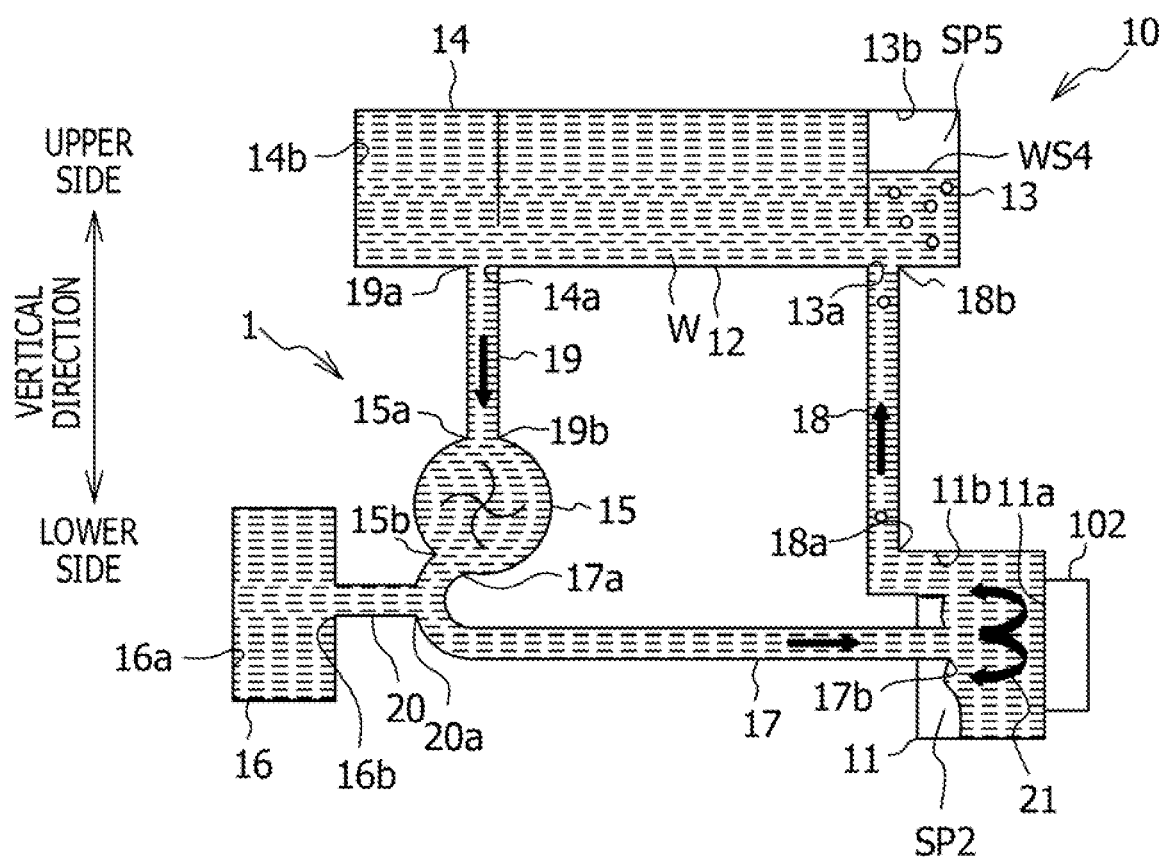
FIG. 4 is an explanatory diagram schematically illustrating the cooling device according to the first embodiment, and illustrating a situation when the pump is operated in the state where the heat dissipating part provided in the cooling device is located on the upper side in the vertical direction.

Hereafter, cases where the posture of the cooling device 10 is changed will be described with reference to FIGS. 3 and 4. FIGS. 3 and 4 illustrate states where the cooling device 10 is rotated by 90° from the states of the cooling device 10 illustrated in FIGS. 1 and 2 so that the heat dissipating part 12 is located on the upper side in the vertical direction. FIG. 3 illustrates a situation when the pump 15 is stopped, and FIG. 4 illustrates a situation when the pump 15 is operated.

In the cooling device 10 in the states illustrated in FIGS. 3 and 4, what is located at the highest position on the upper side in the vertical direction is the heat dissipating part 12. Therefore, as illustrated in FIG. 3, when the pump 15 is stopped, the liquid-phase refrigerant W moves downward due to gravity thereof. A region where the liquid-phase refrigerant W is not present, the region which is formed in part of the internal space of the cooling device 10, moves into the upstream tank 13, the heat dissipating part 12, and the downstream tank 14. As a result, a liquid surface WS3 appears inside these parts, and a space SP4 is formed. Thus, the inside of the pump 15 becomes a state filled with the liquid-phase refrigerant W.

As illustrated in FIG. 4, when the pump 15 is operated, the refrigerant W is discharged from the discharge port 15b of the pump 15 to the first pipe 17. The discharged refrigerant W is supplied to the heat receiving part 11 through the first pipe 17. The refrigerant W supplied to the heat receiving part 11 is blown to the heat generating component installation portion 11a and boils as a result of receiving the heat of the heat generating component 102. Therefore, a space SP2 is formed in the heat receiving part 11 by the gas-phase refrigerant W. The refrigerant W in a state of a gas-liquid mixed phase is sent to the heat dissipating part 12 through the upstream tank 13. At this time, a region where the liquid-phase refrigerant W is not present, the region which is originally formed in part of the internal space of the cooling device 10, is collected in the upstream storage portion 13b in the upstream tank 13. As a result, a liquid surface WS4 appears in the upstream tank 13, and a space SP5 is formed. This is because, in this state, the upstream tank 13, like the tank 16, is located at a higher position in the vertical direction. The refrigerant W sent to the heat dissipating part 12 is cooled in the heat dissipating part 12. The refrigerant W in a state of a gas phase sent to the heat dissipating part 12 is returned to a liquid phase.

Thus, even when the cooling device 10 is in the state where the heat dissipating part 12 is located on the upper side in the vertical direction, since the inside of the pump 15 becomes the state filled with the liquid-phase refrigerant W, the pump 15 is able to be continuously operated.

Figure 5:
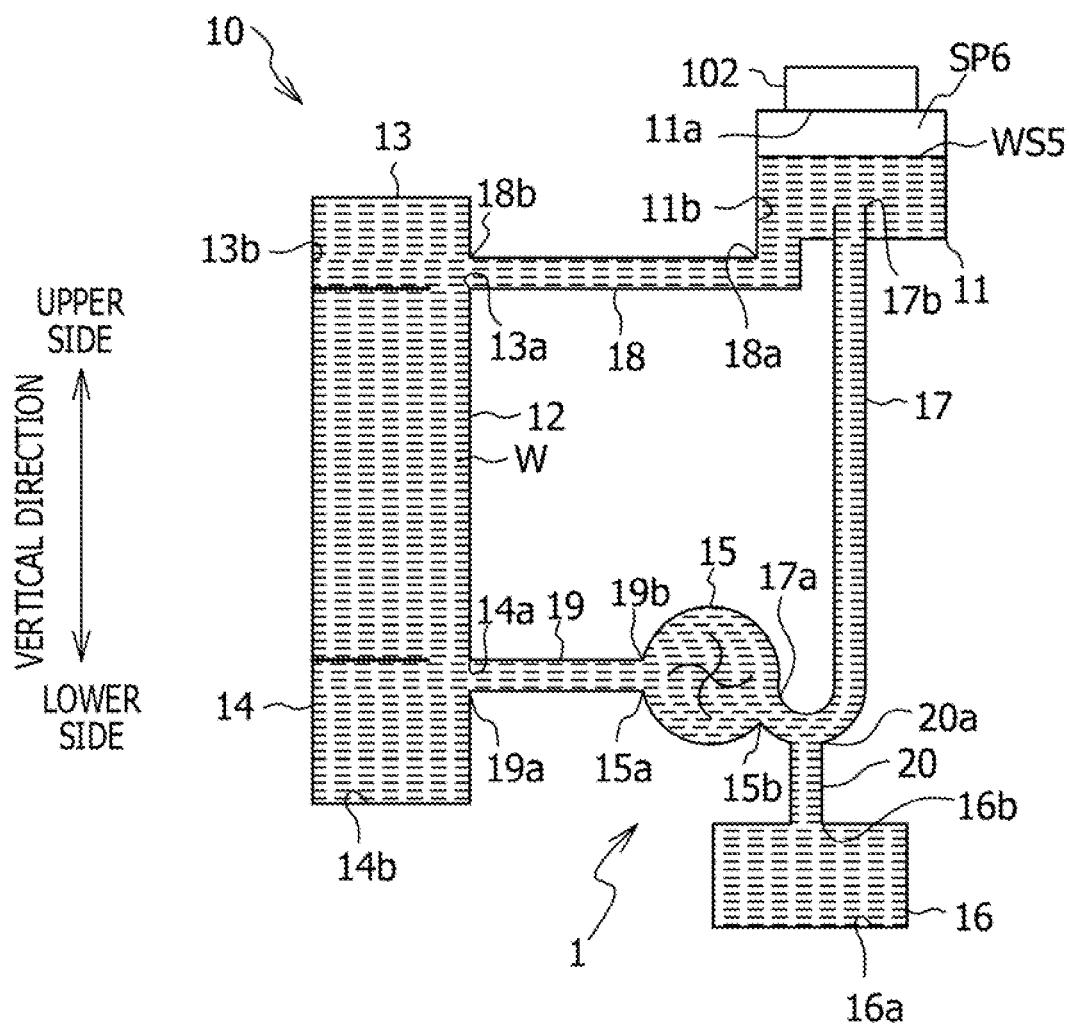
FIG. 5 is an explanatory diagram schematically illustrating the cooling device according to the first embodiment, and illustrating a situation when the pump is stopped in a state where a heat receiving part provided in the cooling device is located on the upper side in the vertical direction.
Figure 6:
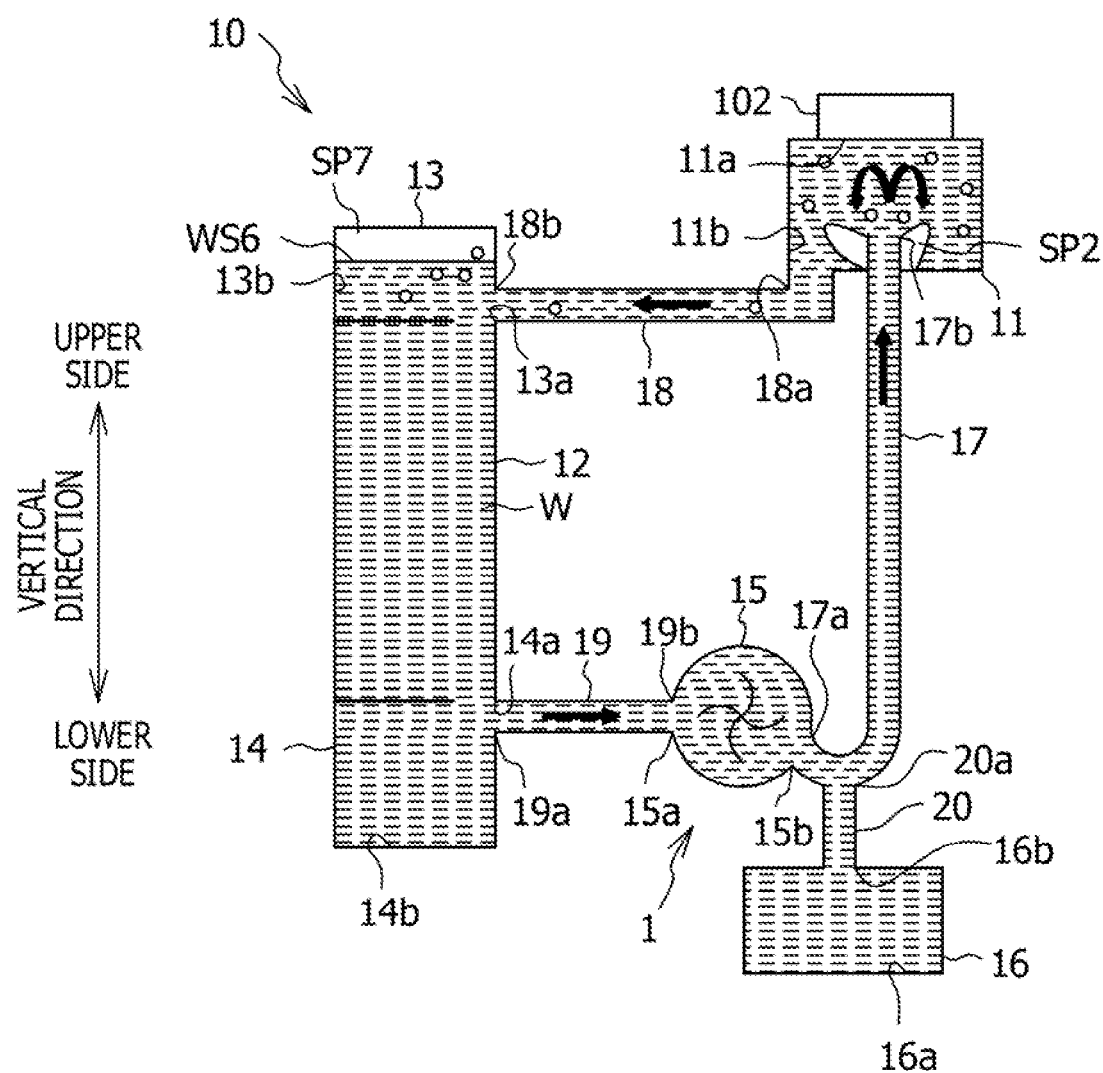
FIG. 6 is an explanatory diagram schematically illustrating the cooling device according to the first embodiment, and illustrating a situation when the pump is operated in the state where the heat receiving part provided in the cooling device is located on the upper side in the vertical direction.

Hereafter, with reference to FIGS. 5 and 6, a case where the posture of the cooling device 10 is further changed will be described. FIGS. 5 and 6 illustrate states where the cooling device 10 is further rotated by 90° from the states of the cooling device 10 illustrated in FIGS. 3 and 4 so that the heat receiving part 11 is located on the upper side in the vertical direction. FIG. 5 illustrates a situation when the pump 15 is stopped, and FIG. 6 illustrates a situation when the pump 15 is operated.

In the cooling device 10 in the states illustrated in FIGS. 5 and 6, what is located at the highest position on the upper side in the vertical direction is the heat receiving part 11. Therefore, as illustrated in FIG. 5, when the pump 15 is stopped, the liquid-phase refrigerant W moves downward due to gravity thereof. A region where the liquid-phase refrigerant W is not present, the region which is formed in part of the internal space of the cooling device 10, moves into the heat receiving part 11. As a result, a liquid surface WS5 appears in the heat-receiving-part storage portion 11b of the heat receiving part 11, and a space SP6 is formed. Thus, the inside of the pump 15 becomes a state filled with the liquid-phase refrigerant W.

As illustrated in FIG. 6, when the pump 15 is operated, the refrigerant W is discharged from the discharge port 15b of the pump 15 to the first pipe 17. The discharged refrigerant W is supplied to the heat receiving part 11 through the first pipe 17. The refrigerant W supplied to the heat receiving part 11 is blown to the heat generating component installation portion 11a and boils as a result of receiving the heat of the heat generating component 102. Therefore, a space SP2 is formed in the heat receiving part 11 by the gas-phase refrigerant W. The refrigerant W in a state of a gas-liquid mixed phase is sent to the heat dissipating part 12 through the upstream tank 13. At this time, a region where the liquid-phase refrigerant W is not present, the region which is originally formed in part of the internal space of the cooling device 10, is collected in the upstream storage portion 13b in the upstream tank 13. As a result, a liquid surface WS6 appears in the upstream tank 13, and a space SP7 is formed. This is because, in this state, the upstream tank 13 has a space that extends on the upper side with respect to the inlet port 13a. The refrigerant W sent to the heat dissipating part 12 is cooled in the heat dissipating part 12. The refrigerant W in the state of a gas phase sent to the heat dissipating part 12 is returned to the state of a liquid phase.

Thus, even when the cooling device 10 is in the state where the heat receiving part 11 is located on the upper side in the vertical direction, since the inside of the pump 15 becomes the state filled with the liquid-phase refrigerant W, the pump 15 is able to be continuously operated.

Even when the heat dissipating part 12 is disposed at the lowest position, likewise, since the inside of the pump 15 is able to be filled with the liquid-phase refrigerant W, the pump 15 is able to be continuously operated likewise.

Second Embodiment

Hereafter, with reference to FIG. 7, a cooling device 30 according to a second embodiment will be described. The cooling device 30 according to the second embodiment includes a first pipe 27 instead of the first pipe 17 provided in the cooling device 10 according to the first embodiment. A tank 36 is provided instead of the tank 16 according to the first embodiment. Since other constituents are the same as those according to the first embodiment, common constituents are denoted by the same reference numbers in the drawings, and detailed description thereof will be omitted.

A first end portion 27a of the first pipe 27 is coupled to the discharge port 15b of the pump 15. A second end portion 27b of the first pipe 27 is disposed so as to be opened in the heat receiving part 11. These points are shared with the first pipe 17 according to the first embodiment. However, in the second embodiment, the branch pipe 20 is not provided, and the tank 36 is incorporated in the middle of the first pipe 27.

Figure 7:
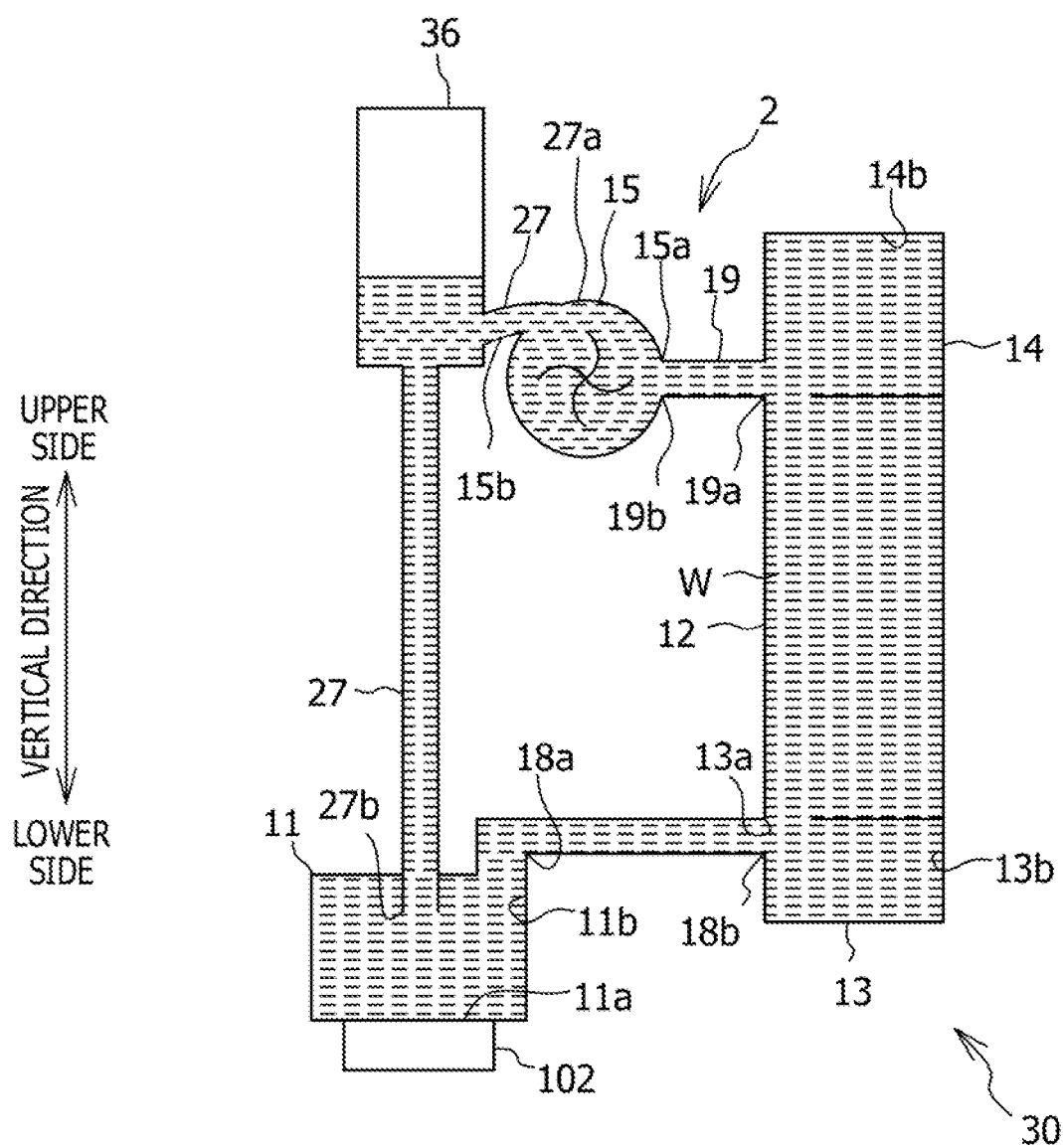
FIG. 7 is an explanatory diagram schematically illustrating a cooling device according to a second embodiment.

As illustrated in FIG. 7, the tank 36, like the tank 16 according to the first embodiment, is disposed at a higher position in the vertical direction than the pump 15 in a state where the pump 15 is located on the upper side in the vertical direction with respect to the heat receiving part 11 and the heat dissipating part 12. Therefore, in the case of the cooling device 30 according to the second embodiment, as in the case of the cooling device 10 according to the first embodiment, the inside of the pump 15 may become a state filled with the refrigerant W in the state where the pump 15 is located on the upper side in the vertical direction with respect to the heat receiving part 11 and the heat dissipating part 12. As in the case of the cooling device 10, even when the installation posture of the cooling device 30 is changed in various ways, since the inside of the pump 15 becomes the state filled with the liquid-phase refrigerant W, the pump 15 is able to be continuously operated.

Since the branch pipe 20 is not provided in the cooling device 30 according to the second embodiment, maintenance, such as cleaning, is able to be easily performed.

Third Embodiment

Hereafter, referring to FIG. 8, a cooling device 40 according to a third embodiment will be described. The cooling device 40 according to the third embodiment includes a third pipe 49 instead of the third pipe 19 provided in the cooling device 10 according to the first embodiment. A tank 46 is provided instead of the tank 16 according to the first embodiment. Accordingly, the downstream tank 14 is not provided. Since other constituents are the same as those according to the first embodiment, common constituents are denoted by the same reference numbers in the drawings, and detailed description thereof will be omitted.

The third pipe 49 couples the pump 15 to the heat dissipating part 12. The tank 46 is incorporated in the middle of the third pipe 49.

Figure 8:
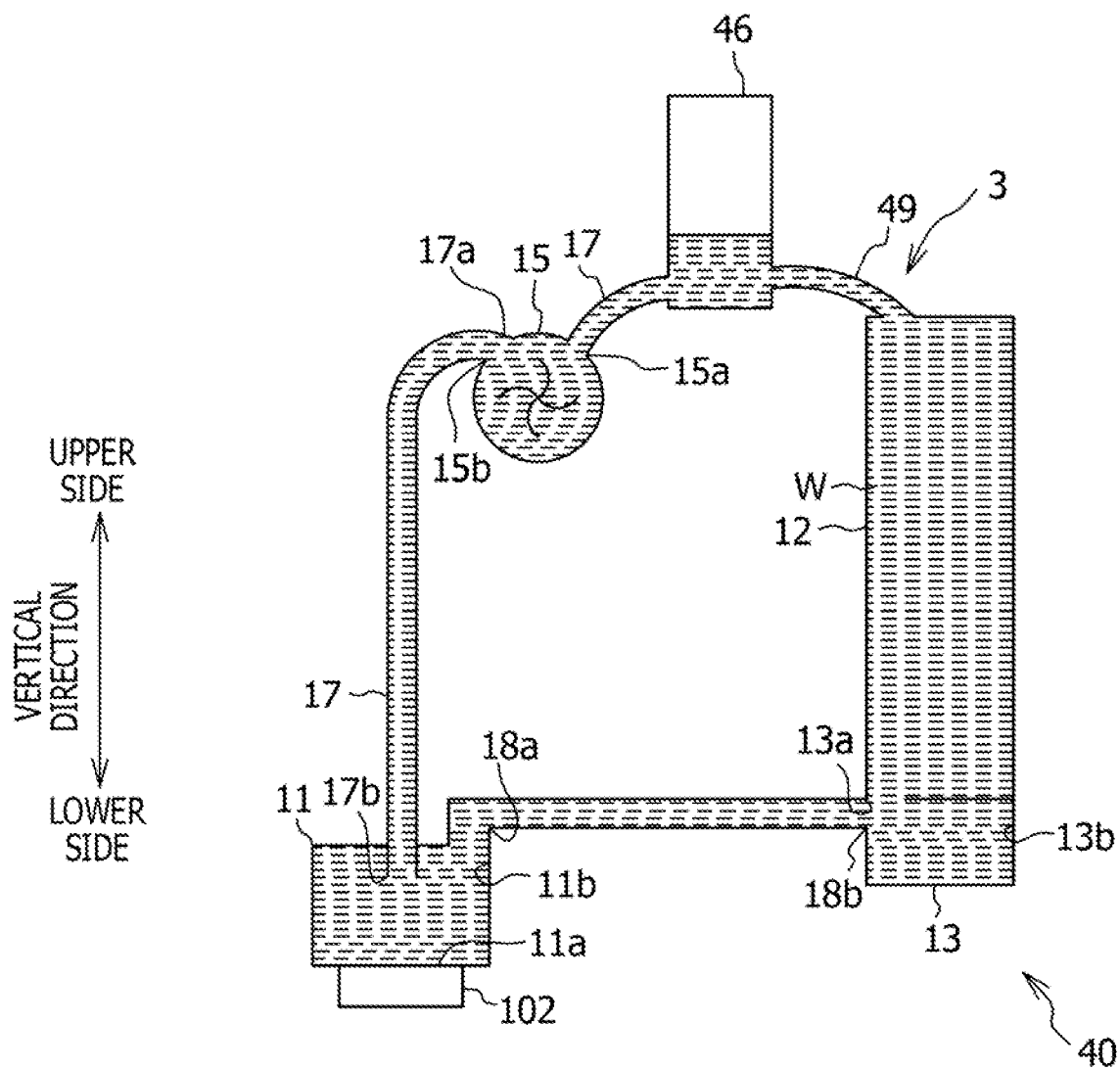
FIG. 8 is an explanatory diagram schematically illustrating a cooling device according to a third embodiment.

As illustrated in FIG. 8, the tank 46, like the tank 16 according to the first embodiment, is disposed at a higher position in the vertical direction than the pump 15 in a state where the pump 15 is located on the upper side in the vertical direction with respect to the heat receiving part 11 and the heat dissipating part 12. Therefore, in the case of the cooling device 40 according to the third embodiment, as in the case of the cooling device 10 according to the first embodiment, the inside of the pump 15 may become a state filled with the refrigerant W in the state where the pump 15 is located on the upper side in the vertical direction with respect to the heat receiving part 11 and the heat dissipating part 12. As in the case of the cooling device 10, even when the installation posture of the cooling device 40 is changed in various ways, since the inside of the pump 15 becomes the state filled with the liquid-phase refrigerant W, the pump 15 is able to be continuously operated.

Since the cooling device 40 according to the third embodiment includes the tank 46 provided on the upstream side of the pump 15, the downstream tank 14 provided in the cooling device 10 according to the first embodiment is able to be omitted, and the configuration is able to be simplified.

Fourth Embodiment

Hereafter, with reference to FIG. 9, a cooling device 50 according to a fourth embodiment will be described. The cooling device 50 according to the fourth embodiment has a combined form of the cooling device 30 according to the second embodiment and the cooling device 40 according to the third embodiment. For example, the cooling device 50 includes the tank 36 incorporated in the first pipe 27 and the tank 46 incorporated in the third pipe 49.

Figure 9:
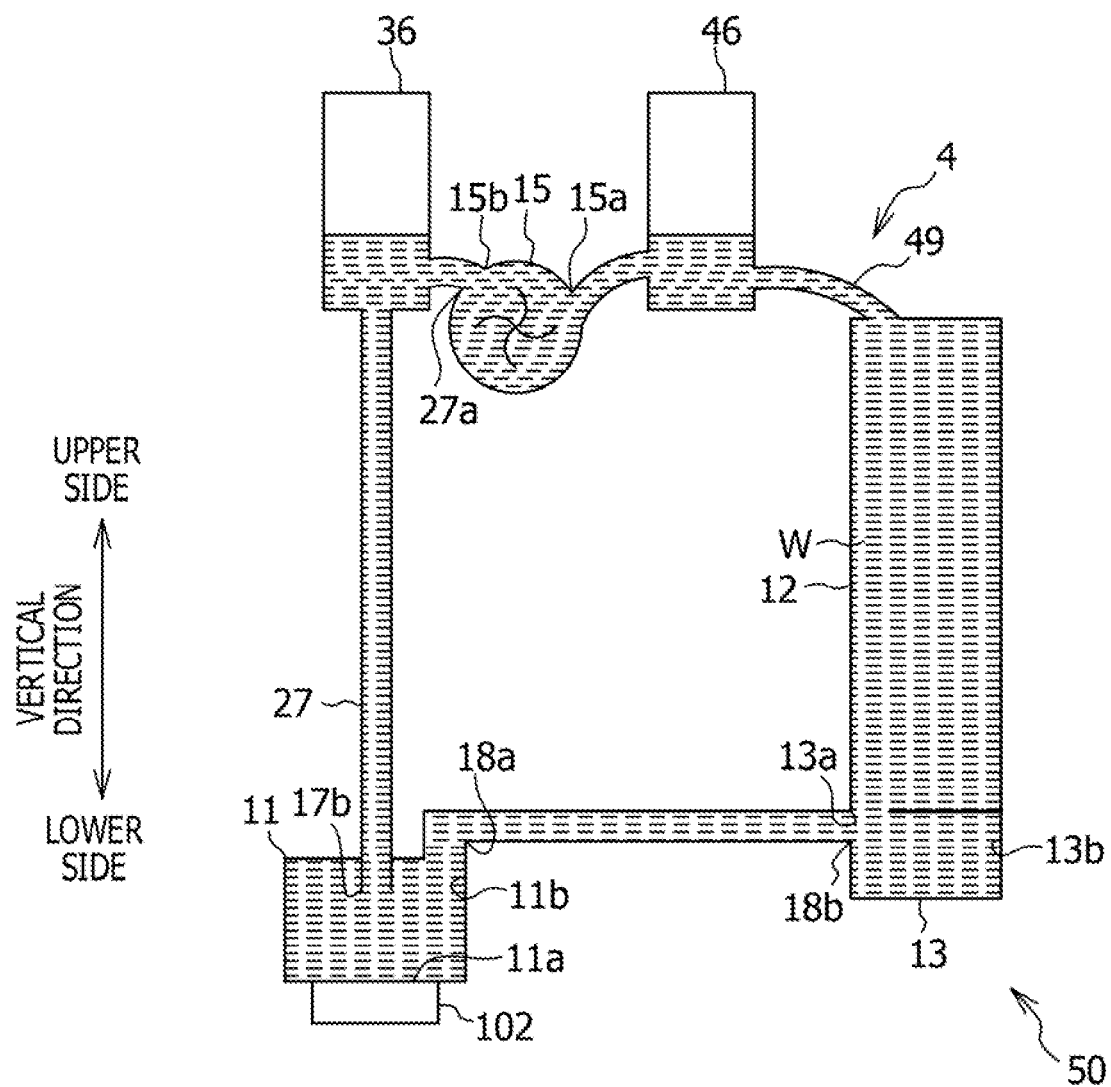
FIG. 9 is an explanatory diagram schematically illustrating a cooling device according to a fourth embodiment.

As illustrated in FIG. 9, the tank 36 and the tank 46, like the tank 16 according to the first embodiment, are disposed at higher positions in the vertical direction than the pump 15 in a state where the pump 15 is located on the upper side in the vertical direction with respect to the heat receiving part 11 and the heat dissipating part 12. Therefore, in the case of the cooling device 50 according to the fourth embodiment, as in the case of the cooling device 10 according to the first embodiment, the inside of the pump 15 may become a state filled with the refrigerant W in the state where the pump 15 is located on the upper side in the vertical direction with respect to the heat receiving part 11 and the heat dissipating part 12. As in the case of the cooling device 10, even when the installation posture of the cooling device 50 is changed in various ways, since the inside of the pump 15 becomes the state filled with the liquid-phase refrigerant W, the pump 15 is able to be continuously operated.

Since the cooling device 40 according to the fourth embodiment includes the tanks provided on the upstream side and the downstream side of the pump 15, the function of filling the pump 15 with the refrigerant W in accordance with a change in posture is able to be enhanced.

Fifth Embodiment

Figure 10:
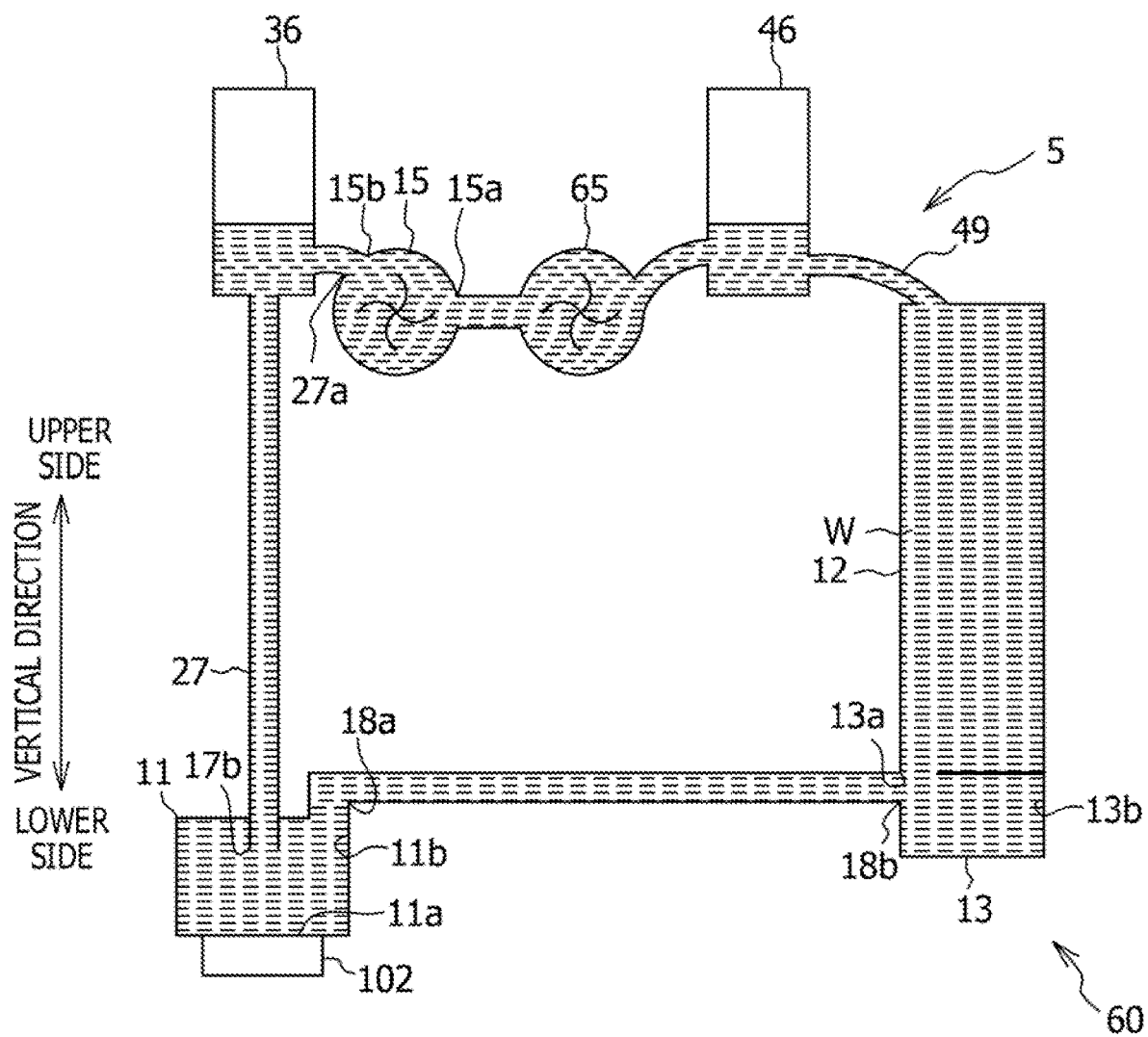
FIG. 10 is an explanatory diagram schematically illustrating a cooling device according to a fifth embodiment.

Hereafter, with reference to FIG. 10, a cooling device 60 according to a fifth embodiment will be described. In the case of the cooling device 60 according to the fifth embodiment, another pump 65 is added to the cooling device 50 according to the fourth embodiment so that the pump 65 is placed side by side with the pump 15. The cooling device 60 includes the tank 36 and the tank 46 as in the case of the cooling device 50. As illustrated in FIG. 10, the tank 36 and the tank 46 are disposed at higher positions in the vertical direction than the pump 15 and the pump 65 in a state where the pump 15 and the pump 65 are located on the upper side in the vertical direction with respect to the heat receiving part 11 and the heat dissipating part 12. Therefore, in the case of the cooling device 60 according to the fifth embodiment, as in the case of the cooling device 10 according to the first embodiment, the inside of the pump 15 and the inside of the pump 65 may become states filled with the refrigerant W in the state where the pump 15 and the pump 65 are located on the upper side in the vertical direction with respect to the heat receiving part 11 and the heat dissipating part 12. As in the case of the cooling device 10, even when the installation posture of the cooling device 50 is changed in various ways, since the inside of the pump 15 and the inside of the pump 65 become the states filled with the liquid-phase refrigerant W, the pump 15 and the pump 65 are able to be continuously operated.

Since the cooling device 60 according to the fifth embodiment includes the tanks so that the number of the tanks corresponds to the number of the pumps, the function of filling the inside of the pump 15 and the pump 65 with the refrigerant W in accordance with a change in posture is able to be enhanced.

Although the preferred embodiments according to the present disclosure have been described in detail above, the present disclosure is not limited to the specific embodiments, and various modifications and changes may be made within the scope of the essence of the present disclosure described in claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cooling device, comprising:
   a circulation channel through which a refrigerant is circulated;
   a heat receiving part which is disposed in the circulation channel and in which the refrigerant receives heat generated by a heat generating component;
   a heat dissipating part which is disposed in the circulation channel and in which the refrigerant dissipates the heat received in the heat receiving part;
   a pump which is disposed in the circulation channel and which sends the refrigerant to the heat receiving part; and
   a tank which is coupled to the circulation channel and which has a space therein,
   a lower side of the tank is disposed at a higher position in a vertical direction than the pump in a state where the pump is located on an upper side in the vertical direction with respect to the heat receiving part and the heat dissipating part.

2. The cooling device according to claim 1, wherein the circulation channel in which the heat receiving part, the heat dissipating part, and the pump are disposed has a sealed structure in which airtightness is secured.

3. The cooling device according to claim 1, wherein the refrigerant is deaerated.

4. The cooling device according to claim 1, wherein the tank is coupled to the circulation channel via a branch pipe branched from the circulation channel, and the branch pipe extends upward in the state where the pump is located on the upper side in the vertical direction with respect to the heat receiving part and the heat dissipating part.

5. The cooling device according to claim 1, wherein the circulation channel includes
   a first pipe through which the refrigerant flows from the pump toward the heat receiving part,
   a second pipe through which the refrigerant flows from the heat receiving part toward the heat dissipating part, and
   a third pipe through which the refrigerant flows from the heat dissipating part toward the pump, and
   wherein the tank is coupled to at least one of the first pipe and the third pipe.

6. The cooling device according to claim 1, wherein the heat receiving part has a space for storing the refrigerant therein.

7. The cooling device according to claim 1, wherein a space for storing the refrigerant is provided on at least one of an upstream side and a downstream side of the heat dissipating part.

8. The cooling device according to claim 1, wherein a capacity of the space in the tank is larger than a capacity occupied by the refrigerant in a gas phase in a region where the circulation channel, the heat receiving part, the heat dissipating part, and the pump are combined, in a state where the refrigerant is boiling.

9. An electronic apparatus, comprising:
   a heat generating component; and
   a cooling device for cooling the heat generating component, the cooling device including
   a circulation channel through which a refrigerant is circulated,
   a heat receiving part which is disposed in the circulation channel and in which the refrigerant receives heat generated by the heat generating component,
   a heat dissipating part which is disposed in the circulation channel and in which the refrigerant dissipates the heat received in the heat receiving part,
   a pump which is disposed in the circulation channel and which sends the refrigerant to the heat receiving part, and
   a tank which is coupled to the circulation channel and which has a space therein,
   a lower side of the tank is disposed at a higher position in a vertical direction than the pump in a state where the pump is located on an upper side in the vertical direction with respect to the heat receiving part and the heat dissipating part.

10. The electronic apparatus according to claim 9, wherein the circulation channel in which the heat receiving part, the heat dissipating part, and the pump are disposed has a sealed structure in which airtightness is secured.

11. The electronic apparatus according to claim 9, wherein the refrigerant is deaerated.

12. The electronic apparatus according to claim 9, wherein the tank is coupled to the circulation channel via a branch pipe branched from the circulation channel, and the branch pipe extends upward in the state where the pump is located on the upper side in the vertical direction with respect to the heat receiving part and the heat dissipating part.

13. The electronic apparatus according to claim 9, wherein the circulation channel includes
   a first pipe through which the refrigerant flows from the pump toward the heat receiving part,
   a second pipe through which the refrigerant flows from the heat receiving part toward the heat dissipating part, and
   a third pipe through which the refrigerant flows from the heat dissipating part toward the pump, and
   wherein the tank is coupled to at least one of the first pipe and the third pipe.

14. The electronic apparatus according to claim 9, wherein the heat receiving part has a space for storing the refrigerant therein.

15. The electronic apparatus according to claim 9, wherein a space for storing the refrigerant is provided on at least one of an upstream side and a downstream side of the heat dissipating part.

16. The electronic apparatus according to claim 9, wherein a capacity of the space in the tank is larger than a capacity occupied by the refrigerant in a gas phase in a region where the circulation channel, the heat receiving part, the heat dissipating part, and the pump are combined, in a state where the refrigerant is boiling.

* * * * *